United States Patent [19]
Leu

[11] Patent Number: 6,114,723
[45] Date of Patent: Sep. 5, 2000

[54] FLASH MEMORY CELL USING POLY TO POLY TUNNELING FOR ERASE

[75] Inventor: Len-Yi Leu, Hsinchi, Taiwan

[73] Assignee: Windbond Electronic Corp, Hsinchu, Taiwan

[21] Appl. No.: 09/156,583

[22] Filed: Sep. 18, 1998

[51] Int. Cl.⁷ ................... H01L 29/788; H01L 29/76; H01L 27/148
[52] U.S. Cl. ................ 257/316; 257/316; 257/317; 257/239; 257/367; 257/321; 257/249; 257/775
[58] Field of Search ................... 257/316, 317, 257/239, 367, 321, 249, 775

[56] References Cited

U.S. PATENT DOCUMENTS

| | | | |
|---|---|---|---|
| 5,267,194 | 11/1993 | Jang | 365/185 |
| 5,494,838 | 2/1996 | Chang et al. | 437/43 |
| 5,554,553 | 9/1996 | Harari | 437/43 |
| 5,783,473 | 7/1998 | Sung | 438/265 |

*Primary Examiner*—David Hardy
*Assistant Examiner*—Matthew E. Warren
*Attorney, Agent, or Firm*—W. Wayne Liauh

[57] ABSTRACT

An improved split gate flash memory cell is disclosed whose floating gate is formed to have a reentrant angle such that its width increases with increased distance from the substrate so as to minimize the possibility of defects in the poly oxide layer overlaying the floating gate. The split gate flash memory is fabricated using a process comprising the steps of: (a) forming a floating gate with an overlaying poly oxide layer on a substrate, wherein the floating gate is etched to have a reentrant angle such that its width generally increases with a distance from the substrate; (b) forming a CVD nitride spacer on the floating gate using a CVD nitride deposition, then anisotropic etching the CVD nitride to form a nitride spacer adjacent to the floating gate; (c) forming a control gate on the floating gate wherein the control gate and the floating gate are separated by the poly oxide and the nitride spacer; and (d) forming a source and drain in the substrate using a source and drain implantation.

11 Claims, 4 Drawing Sheets

FLASH MEMORY CELL USING POLY TO POLY TUNNELING FOR ERASE

FIELD OF THE INVENTION

The present invention relates to a novel split gate flash memory with improved erase operations and the method of making the same. More specifically, the present invention relates to a method for making improved split gate flash memory which utilizes the poly1 to poly2 Fowler-Nordheim channeling of charges through the sharp corner at the floating gate edge to achieve charge erase operation, and the improved split gate flash memory cells made therefrom. The present invention prevents or at least minimizes potential degradations in erase efficiency due to charge trapping as a result of oxide defects which exist at the sharp corner at the edges of the floating gate. The present invention also allows the size of the floating gate, thus the overall memory cell dimension, to be smaller than that typically achievable from the underlying photolithography technology. By doing so, the present invention allows scaling-down of the flash memory cells without incurring large expenses typically associated with equipment and/or process upgrade.

BACKGROUND OF THE INVENTION

Flash memories are high-density nonvolatile semiconductor memories offering fast access times. Compared to other nonvolatile semiconductor memories such as conventional EPROMs or EEPROMs, flash memories are most suitable for applications wherein there are expected frequent write and read operations. Because of its light weight compared to magnetic memories such as hard disk or floppy disk memories, flash memory has a tremendous potential in the consumer electronics market. With the rapid growth of digital cameras and the desire for light-weight notebook PCs, the demand for even higher density flash memories is ever increasing.

FIG. 1A shows a top view cell layout of a typical flash memory, and FIGS. 1B and 1C are illustrative schematic diagrams of the flash memory cell along lines B–B' and C–C', respectively. The flash memory cell contains a semiconductor substrate 1, which typically is a P-type silicon substrate with a doping level ranging from 5 to 50 ohm-cm. Within the substrate 1, there are source region 2, typically an N-doped silicon, a drain region 3, also an N-doped silicon, and a channel region 4 between the source region 2 and the drain region 3. A tunnel oxide layer 5 is disposed over the channel region and the source and drain regions. Disposed over the tunnel oxide layer are one or more floating gate (poly-1), which, as shown in FIG. 1C, is positioned over a portion of the source region 2 and over a portion of the channel region 4. An insulating layer 6, which can be silicon dioxide, silicon nitride, or silicon oxynitride, is disposed covering the floating gate. A control gate is then disposed which covers a portion of the floating gate and a portion of the channel region. During an erase operation, a ground potential is applied to the drain and the source regions, and a high positive voltage is applied to the control gate. The positive charge on the control gate causes charges, if any, on the floating gate to be induced through the so-called Fowler-Nordheim tunneling mechanism to tunnel through the insulating layer 6 to the control gate, allowing the floating gate to be discharged.

To maximize the Fowler-Nordheim tunneling effect, sharp corners are formed at the edge of the floating gate. The sharp corners are created by selectively forming poly oxide only in the floating gate region during one of the photolithographic processes implemented in fabricating the flash memory cell. FIGS. 2A and 2B show the longitudinal and transverse views, respective, of the memory cell during the fabrication process, wherein the poly oxide layer is formed on top of the floating gate, using the nitride layer as a mask. However, primarily due to the stress exerted at the edge of the nitride layer, often defects in such oxide layer will be created near the sharp corner neighborhood of the floating gate, causing charges to be trapped in the oxide defects at the sharp corner and the resultant degradations in the erase efficiency. The flash memory cells with defective poly oxide often shows poor cycling performance, primarily due to erase failure.

U.S. Pat. Nos. 5,045,488, 5,067,1078, 5,202,850, and 5,278,087 disclose a single transistor electrically programmable and erasable memory cell having a second insulating layer with atop wall portion over the floating gate and a side wall portion immediately adjacent to the floating gate and has a thickness which permits the Fowler-Nordheim tunneling or charges therethrough. However, these patents never taught or suggested the existence of the defects in the oxide layer near the sharp corner neighborhood of the floating gate as mentioned above which can result in degradations in the erase efficiency of the memory cell, and, in turn, degradations in the cycling performance.

SUMMARY OF THE INVENTION

The primary object of the present invention is to develop an improved split gate flash memory with reduced rate of erase failures. More specifically, the primary object of the present invention is to develop a method for making improved split gate flash memory cells having a high integrity oxide layer to ensure high erase efficiency, wherein the memory cell utilizes the poly1 (floating gate) to poly2 (control gate) Fowler-Nordheim channeling of charges through the sharp corner at the floating gate edge to achieve charge erase operation.

The improved split gate flash memory cells disclosed in the present invention prevent or at least minimize potential degradations of erase efficiency experienced from the prior art flash memory cells which occur due to charge trapping as a result of oxide defects which exist at the sharp corner at the edges of the floating gate. The method disclosed in the present invention also allows the size of the floating gate, thus the overall memory cell dimension, to be smaller than that typically achievable from the underlying photolithography technology. By doing so, the present invention allows scaling of the flash memory cells without incurring large expenses typically associated with equipment upgrade.

One of the key element of the present invention is to etch a reentrant angle during the floating gate etch and other associated steps, so as to ensure that a sharp angle is preserved at the corner of the floating gate. The present invention comprises the following main steps:

(1) Forming a floating gate having a width generally increasing with distance from the substrate by etching a reentrant angle during the floating gate etch;

(2) Forming a nitride spacer on the floating gate using a CVD nitride deposition and subsequent anisotropic etching of the CVD nitride;

(3) Forming a control gate on the floating gate to assume a split gate structure; and (4) Source and Drain implantation.

Each of the main steps also comprises several sub-steps. These are discussed below:

(1) Forming a floating gate having a width generally increasing with distance from a substrate by etching a reentrant angle during the floating gate etch:

In this main step, a tunnel oxide layer is first formed on a substrate, followed by the deposition of poly1 layer and subsequent poly1 implantation. Then a poly oxide layer is formed on the poly1 layer. The thickness of the poly oxide layer should be adequate to reduce the coupling between the control gate and the floating gate that will be ultimately formed. Typically, the thickness of the poly oxide layer should be between about 1,000 and 3,000 Å. A poly1 mask is employed to define the floating gate pattern. Finally, the stack of poly oxide and poly1 layers are etched under conditions to form a reentrant angle. The magnitude of the reentrant angle is a design parameter which should be the best compromise between erase efficiency and the step coverage of the oxide/nitride films to be subsequently formed. Typically a reentrant angle of about ±15° should be adequate.

(2) Forming a nitride spacer on the floating gate using a CVD nitride deposition and anisotropic etching of the CVD nitride:

In this main step, an oxide layer of about 100 to 250 Å is deposited around the floating gate via a chemical vapor deposition (CVD) technique, followed by the CVD deposition of a nitride layer. These two insulation layers are called CVD oxide layer and CVD nitride layer, respectively. Finally, an anisotropic etch is applied on the CVD nitride to form a nitride spacer on the floating gate.

(3) Forming a control gate on the floating gate to assume a split gate structure; and In main step (3), a poly2 layer is deposited on the substrate covering the floating gate and the associated oxide and nitride layers, followed by poly2 implantation and polycide formation. A poly2 mask is employed to define the control gate pattern. Finally, a poly2 etch is performed to form the control gate.

(4) Source and Drain implantation.

In this main step, a source implant mask is first applied, followed by a LATID (LArge Tiltangle Implanted Drain) source implant with four way rotations. The LATID angle should preferably be close to the reentrant angle of poly1. Finally, the photoresist is removed and the source implant is annealed. Similar procedure is applied to achieve a drain implant.

The reentrant angle formed at the floating gate eliminates or at least minimizes the stress that the nitride may exert on the floating gate, thus eliminating or at least minimizing the possibility that defects may be formed in the poly oxide. As a result, failure rate during erase operations can be at least substantially reduced.

BRIEF DESCRIPTION OF THE DRAWING

The present invention will be described in detail with reference to the drawing showing the preferred embodiment of the present invention, wherein.

DETAILED DESCRIPTION OF THE PREFERRED EMBODIMENT

The present invention discloses a novel structure for a split gate flash memory which substantially reduces the rate of erase failures. The improved split gate flash memory is fabricated using a novel process so as to impart a high integrity oxide layer between the poly1 layer (floating gate) and the poly2 (control gate) where Fowler-Nordheim channeling of charges through the sharp corner at the floating gate edge facilitates the charge erase operation.

Figure 1A:
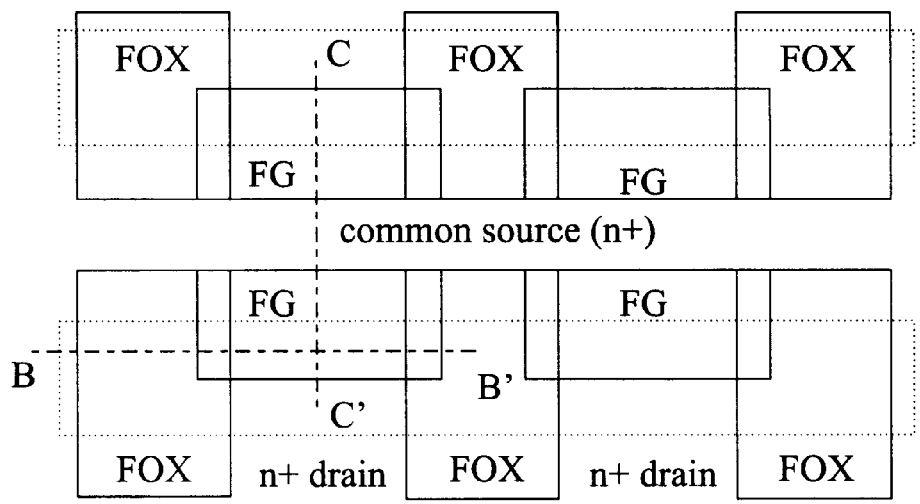
FIG. 1A is a top view cell layout of a typical flash memory.
Figure 1B:
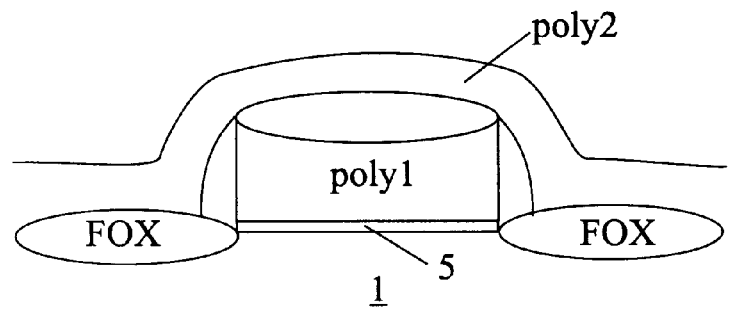
FIGS. 1B and 1C are illustrative schematic diagrams of the flash memory cell as shown in FIG. 1A along lines B–B' and C–C', respectively.
Figure 1C:
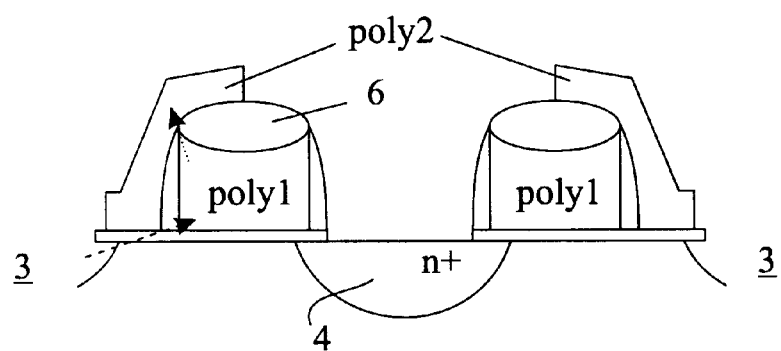
Figure 2A:
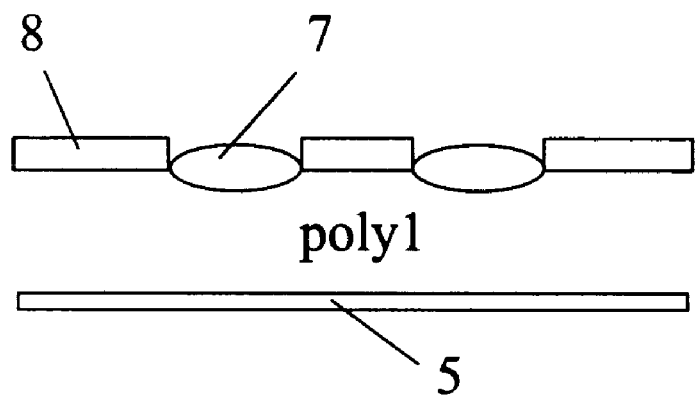
FIGS. 2A and 2B show the longitudinal and transverse views, respective, of a conventional memory cell during the intermediate stage of the fabrication process, wherein the poly oxide layer is formed on top of the floating gate, using the nitride layer as a mask.
Figure 2B:
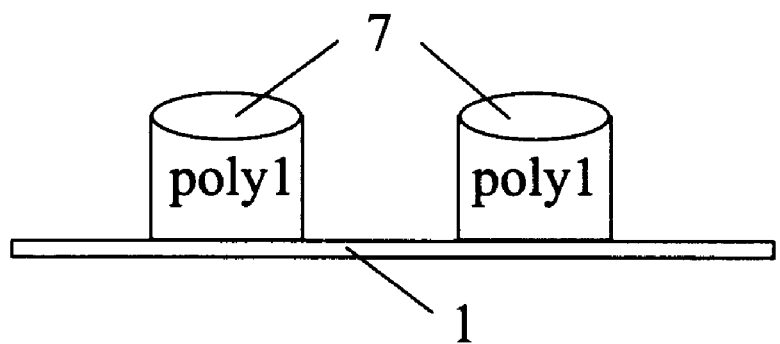

To under how the present invention improves the erase operation, we first examine FIGS. 1 AC, and FIGS. 2A–B. FIG. 1A shows a top view of a cell layout of a typical flash memory, and FIGS. 1B and 1C are illustrative schematic diagrams of the flash memory cell along lines B–B' and C–C', respectively. The flash memory cell contains a semiconductor substrate 1, which typically is a P-type silicon substrate with a doping level ranging from 5 to ohm-cm. Within the substrate 1, there are source region 2, typically an N-doped silicon, a drain region 3, also an N-doped silicon, and a channel region 4 between the source region 2 and the drain region 3. A tunnel oxide layer 5 is disposed over the channel region and the source and drain regions. Disposed over the tunnel oxide layer are one or more floating gate (poly-1), which, as shown in FIG. 1C, is positioned over a portion of the source region 2 and over a portion of the channel region 4. An insulating layer 6, which can be silicon dioxide, silicon nitride, or silicon oxynitride, is disposed covering the floating gate. A control gate is then disposed which covers a portion of the floating gate and a portion of the channel region.

The dashed line in FIG. 1C shows the programming path, and the dotted line shows the erase path. During an erase operation, a ground potential is applied to the drain and the source regions, and a high positive voltage is applied to the control gate. The positive charge on the control gate causes charges, if any, on the floating gate to be induced through the so-called Fowler-Nordheim tunneling mechanism to tunnel through the insulating layer between the sharp corner of the floating gate and the control gate, allowing the floating gate to be discharged.

To maximize the Fowler-Nordheim tunneling effect, sharp corners are formed at the edge of the float gate. FIGS. 2A and 2B show the longitudinal and transverse views, respectively, of the memory cell during the fabrication process, wherein the poly oxide layer 7 is formed on top of the poly1 layer, using the nitride layer 8 as a mask. The sharp corners are created by selectively forming poly oxide only in the floating gate region during one of the photolithographic processes implemented in fabricating the flash memory cell. Due to the stress exerted by the nitride layer at the edge thereof, defects in such oxide layer can often be created near the neighborhood of sharp corner of the floating gate. This can cause charges to be trapped in the oxide defects at the sharp corner and result in degradations in the erase efficiency. Erase failure is a major problem in cycling tests. Poor cycling test results are often observed in flash memory cells with defective poly oxide.

Figure 3A:
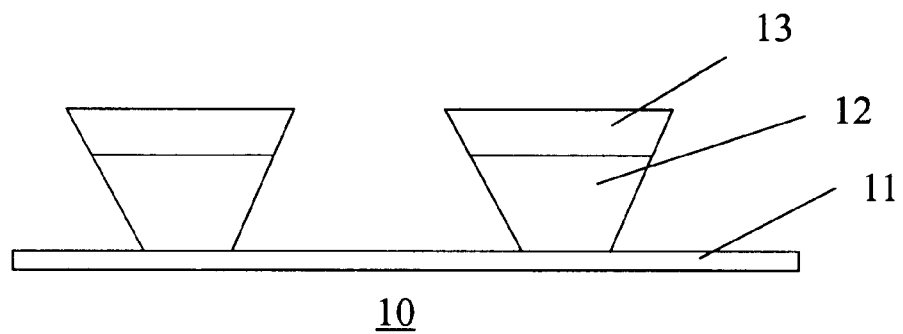
FIG. 3A is a illustrative side view of the flash memory cell after main step (a) of the fabrication process.

FIGS. 3A–3D illustrate the various stages of the process in fabricating the split gate flash memory of the present invention. As discussed earlier, one of the key element of the present invention is to etch a reentrant angle during the floating gate etch and other associated steps, so as to ensure that a sharp angle is preserved at the corner of the floating gate. The present invention comprises the following main steps A through D:

(A) Forming a floating gate having a width generally increasing with distance from a substrate by etching a reentrant angle during the floating gate etch:

FIG. 3A is a illustrative side view of the flash memory cell after main step (A) of the fabrication process. Main step (A) comprises the following steps:

(a) Forming a tunnel oxide layer 11 on a substrate 10;

(b) Depositing a poly1 layer 12, which will eventually become the floating gate, on the tunnel oxide layer 11, followed by poly1 implantation;

(c) Forming a poly oxide layer 13 on the poly1 layer 12; the thickness of the poly oxide layer should be adequate to reduce the coupling between the control gate and the floating tate that will be ultimately formed; typically, the thickness of the poly oxide layer should be between about 1,000 and 3,000 Å;

(d) Using a poly1 mask to define a floating gate pattern; and (e) Etching poly oxide layer 13 and poly1 layer 12 under conditions to form a reentrant angle in both layers; the magnitude of the reentrant angle is a design parameter which should be the best compromise between erase efficiency and the step coverage of the oxide/nitride films to be subsequently formed.

Figure 3B:
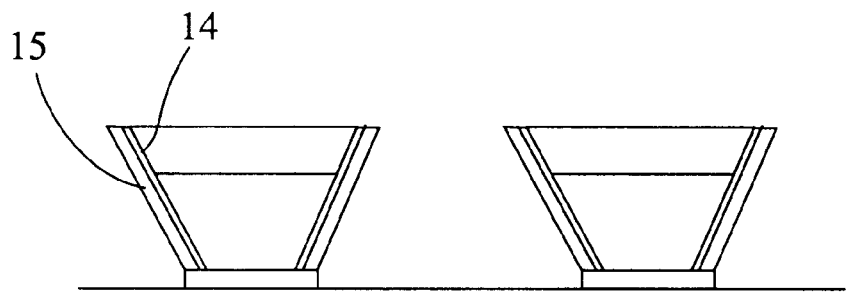
FIG. 3B is a illustrative side view of the flash memory cell after main step (b) of the fabrication process.

(B) Forming a nitride spacer on the floating gate using a CVD nitride deposition and anisotropic etching of the CVD nitride:

FIG. 3B is a illustrative side view of the flash memory cell after main step (B) of the fabrication process. Main step (B) comprises the following steps:

(a) depositing a CVD oxide layer 14 of about 100 to 250 Å around the floating gate via a chemical vapor deposition (CVD) technique;

(b) depositing a CVD nitride layer 15 of about 300 to 700 Å around the oxide layer via a chemical vapor deposition (CVD) technique; and (c) applying an anisotropic etch so as to form a nitride spacer on the floating gate.

Figure 3C:
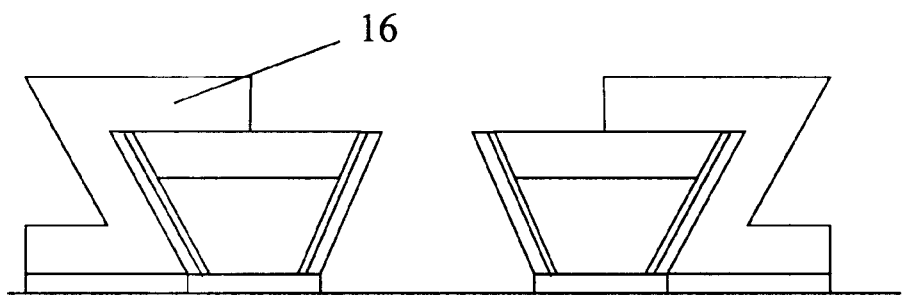
FIG. 3C is a illustrative side view of the flash memory cell after main step (c) of the fabrication process.

(C) Forming a control gate on the floating gate to assume a split gate structure:

FIG. 3C is a illustrative side view of the flash memory cell after main step (C) of the fabrication process. Main step (C) comprises the following steps:

(a) depositing a poly2 layer 16 on the substrate covering the floating gate and the associated oxide and nitride layers, followed by poly2 implantation;

(b) Using a poly2 mask to define a control gate pattern; and (c) Applying a poly2 etch is to form the control gate.

Figure 3D:
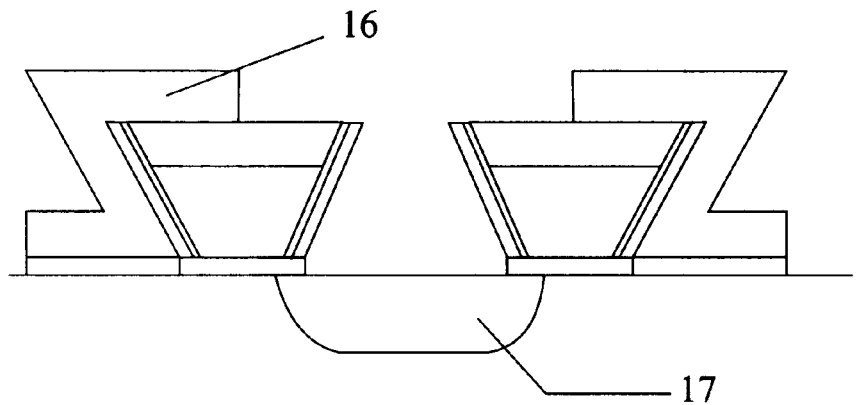
FIG. 3D is a illustrative side view of the flash memory cell after main step (d) of the fabrication process.
Figure 3E:
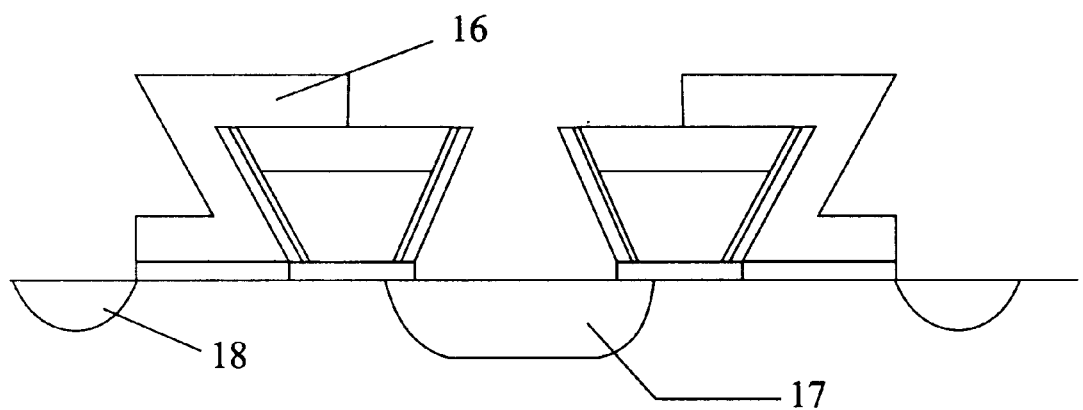

(D) Source and Drain implantation:

FIG. 3D is a illustrative side view of the flash memory cell after main step (D) of the fabrication process. Main step (D) comprises the following steps:

(a) Forming a source implant mask using a photoresist;

(b) Using a LATID (LArge Tilt-angle Implanted Drain) source implant with four way rotations technique to form a source 17 in the substrate; the LATID angle should preferably be close to the reentrant angle of poly1;

(c) removing the photoresist and annealing the source;

(d) using a drain implant mask in conjunction with a photoresist to form a drain in the substrate, following by removing the photoresist.

By having the floating gate formed with a reentrant angle, the improved split gate flash memory cells disclosed in the present invention prevent or at least minimize potential degradations of erase efficiency experienced in prior art flash memory cells due to charge trapping as a result of oxide defects which exist at the sharp corner at the edges of the floating gate. The method disclosed in the present invention also allows the size of the floating gate, thus the overall memory cell dimension, to be smaller than that typically achievable from the underlying technology. By doing so, the present invention allows scaling of the flash memory cells to be achieved without incurring large expenses typically associated with equipment upgrade.

The foregoing description of the preferred embodiments of this invention has been presented for purposes of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. A split gate flash memory cell comprising:

(i) a floating gate and a poly oxide layer on top of said floating gate, both being etched to have a common floating angle such that the width of said poly oxide layer and said floating gate generally increases with increased distance from a substrate, and both said poly oxide layer and said floating gate have a sharp corner;

(ii) an oxide sidewall spacer formed around a sidewall of said floating gate and said poly oxide layer, said oxide sidewall spacer being generally parallel to said reentrant angle, said oxide sidewall spacer being different from said poly oxide layer so as to allow said poly oxide layer to maintain a sharp corner;

(iii) a nitride sidewall spacer formed around said oxide sidewall spacer, said nitride sidewall spacer also being generally parallel to said reentrant angle.

2. The split gate flash memory cell according to claim 1 which is fabricated using a process comprising the following steps:

(a) forming a floating gate with an overlaying poly oxide layer on a substrate, wherein said floating gate and said overlaying poly oxide layer is etched to have a reentrant angle such that its width generally increases with a distance from said substrate;

(b) forming a CVD oxide sidewall spacer and a CVD nitride sidewall spacer on said floating gate using a CVD oxide deposition and a CVD nitride deposition, then anisotropic etching said CVD oxide and said CVD nitride to form an oxide sidewall spacer and a nitride sidewall spacer adjacent to said floating gate;

(c) forming a control gate on the floating gate wherein said control gate and said floating gate are separated by said poly oxide and said nitride spacer; and (d) forming a source and drain in said substrate using a source and drain implantation.

3. The split gate flash memory cells according to claim 2 wherein said floating gate is formed in step (a) using a process comprising the following sub-steps:

(a) forming a tunnel oxide layer on said substrate;

(b) depositing a poly1 layer, which will eventually become said floating gate, on said tunnel oxide layer, followed by poly1 implantation;

(c) forming a poly oxide layer on said poly1 layer;

(d) using a poly1 mask to define a floating gate pattern; and (e) etching said poly oxide layer and said poly1 layer under conditions so as to form a reentrant angle in both layers.

4. The split gate flash memory cells according to claim 3 wherein said poly oxide layer has a thickness between about 1,000 and 3,000 Å.

5. The split gate flash memory cells according to claim 2 wherein said nitride spacer is formed in step (b) using a process comprising the following sub-steps:

(a) depositing a CVD oxide layer around the floating gate via a chemical vapor deposition (CVD) technique;

(b) depositing a CVD nitride layer around the oxide layer via a chemical vapor deposition (CVD) technique; and (c) applying an anisotropic etch on said CVD nitride layer so as to form a nitride spacer on the floating gate.

6. The split gate flash memory cells according to claim 5 wherein said CVD oxide layer has a thickness of about 100 to 250 Å.

7. The split gate flash memory cells according to claim 5 wherein said CVD nitride layer of about 300 to 700 Å.

8. The split gate flash memory cells according to claim 2 wherein said control gate is formed in step (c) using a process comprising the following sub-steps:

(a) depositing a poly2 layer on said substrate covering said floating gate and said poly oxide layer and nitride spacer, followed by poly2 implantation;

(b) using a poly2 mask to define a control gate pattern; and (c) applying a poly2 etch is to form a control gate.

9. The split gate flash memory cells according to claim 2 wherein said source and drain are formed in step (d) using a process comprising the following sub-steps:

(a) forming a source implant mask using a photoresist;

(b) forming a source in said substrate using a source implant process;

(c) removing the photoresist and annealing the source;

(d) using a drain implant mask in conjunction with a photoresist to form a drain in the substrate, following by removing the photoresist.

10. The split gate flash memory cells according to claim 9 wherein said source implant process is a LATID (LArge Tilt-angle Implanted Drain) source implant with four way rotations.

11. The split gate flash memory cells according to claim 10 wherein said LATID process causes a LATID angle to be formed in said source implant which is close to said reentrant angle of said floaring gate.

* * * * *